(12) United States Patent
Suaris et al.

(10) Patent No.: US 6,223,334 B1
(45) Date of Patent: Apr. 24, 2001

(54) AUTOMATIC TOPOLOGY SYNTHESIS AND OPTIMIZATION

(75) Inventors: Peter R. Suaris, Camas, WA (US); Ashok Vittal, San Jose, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 09/165,263

(22) Filed: Oct. 1, 1998

(51) Int. Cl.[7] ................................................. G06F 17/50
(52) U.S. Cl. .................................. 716/12; 716/8
(58) Field of Search .................. 716/2, 7, 8, 9, 716/10, 12, 13, 18, 6

(56) References Cited

U.S. PATENT DOCUMENTS

| | | | | |
|---|---|---|---|---|
| 5,410,491 | * | 4/1995 | Minami | 716/6 |
| 5,557,779 | * | 9/1996 | Minami | 716/6 |
| 5,568,636 | * | 10/1996 | Koford | 716/9 |
| 5,661,663 | * | 8/1997 | Scepanovic et al. | 716/8 |
| 5,734,580 | * | 3/1998 | Rakov | 364/488 |
| 5,754,444 | * | 5/1998 | Koford | 716/9 |
| 6,006,025 | * | 12/1999 | Cook et al. | 716/14 |
| 6,080,206 | * | 6/2000 | Tadokoro et al. | 716/10 |

OTHER PUBLICATIONS

Blennemann et al., "Off–Chip 400mbps Signal Transmission: Noise Reduction Using Non–Resonant Lengths and Other Techniques," IEEE, pp. 138–142, 1996.*

Nekili et al., "Pipelined H–Trees for High–Speed Clocking of Large Integrated Systems in Presence of Process Variations," IEEE Trans on VLSI Systems, vol. 5, No. 2, pp 161–174, Jun. 1997.*

*Place and Route: and Man vs. Machine;* Authors: Rod Strange and Peter Suaris; Miller Freeman, Inc. reprinted with permission from Printed Circuit Design, The Definitive Journal of Printed Circuit Board Design, Dec. 1995, vol. 12, No. 12, no page #.

* cited by examiner

*Primary Examiner*—Matthew Smith
*Assistant Examiner*—Leigh Marie Garbowski
(74) *Attorney, Agent, or Firm*—Columbia IP Law Group, LLC (57) ABSTRACT

The present invention includes a net topology strategy, referred to as a J-tree model, that meets monotonicity and ring back constraints for nets with bi-directional drivers without much degradation in delay. The present invention includes a method that can be used to automatically construct a J-tree for a given net. A J-tree is generated by identifying at least two clusters of nodes and interconnecting the nodes so that each node has a sibling node that is the same distance from a parent node. Each cluster comprises at least a minimum geometric number of nodes. The nodes are interconnected by first locating a star point for each cluster so that the nodes in each cluster are equidistant from the star point. Then, the star point for each cluster is interconnected forming the topology.

13 Claims, 6 Drawing Sheets

AUTOMATIC TOPOLOGY SYNTHESIS AND OPTIMIZATION

FIELD OF THE INVENTION

The present invention pertains to the field of Electronic Design Automation (EDA). More particularly, this invention relates to a method and apparatus for automatic topology synthesis and optimization.

BACKGROUND OF THE INVENTION

Advances in chip manufacturing technology have lead to printed circuit boards with input/output drivers having very fast signal transition times. Fast signal transition times can make even short interconnects behave like transmission lines with all of the related signal integrity problems. Clock frequencies in system designs have also continued to increase. Faster clock frequencies result in tighter delay margins when designing interconnects. Thus, the challenge of today's high speed board design is to design the interconnects within the available delay margins while maintaining the desired signal quality. Signal quality is usually measured in terms of overshoot, undershoot, monotonicity, and ringback.

The above mentioned interconnect design problem is critical for high speed nets with a large number of pins. It is even more critical for nets with bi-directional drivers, since it is necessary to make sure that the timing margins and signal quality are maintained for every driver on the net.

Designing interconnects to meet the specified constraints consists of two stages. One stage is topology design and the other stage is termination selection. For example, a daisy chain topology may be designed having a series termination scheme. In today's design methodology, both stages are frequently done manually. For instance, a designer may manually explore the infinite space of possible topologies and termination schemes for each net in a design. This is a very time consuming task where the engineer has to set up simulations for each design point to verify the delay and signal quality constraints are met.

A need exists, therefore, for a design tool which can automate topology and termination selection for a general net, while adhering to delay and signal quality constraints. In particular, an automated design tool is needed for interconnecting multiple pin nets and nets with bi-directional drivers.

SUMMARY OF THE INVENTION

The present invention includes a net topology strategy, referred to as a J-tree model, that meets monotonicity and ring back constraints for nets with bi-directional drivers without much degradation in delay. The present invention includes a method that can be used to automatically construct a J-tree for a given net. A J-tree is generated by identifying at least two clusters of nodes and interconnecting the nodes so that each node has a sibling node that is the same distance from a parent node. Each cluster comprises at least a minimum geometric number of nodes. The nodes are interconnected by first locating a star point for each cluster so that the nodes in each cluster are equidistant from the star point. Then, the star point for each cluster is interconnected forming the topology.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

DETAILED DESCRIPTION

In the following description, numerous specific details are set forth in order to provide a thorough understanding of the present invention. However, those skilled in the art will understand that the present invention may be practiced without these specific details. In other instances, well known methods, procedures, components, and circuits have not been described in detail.

Figure 1:
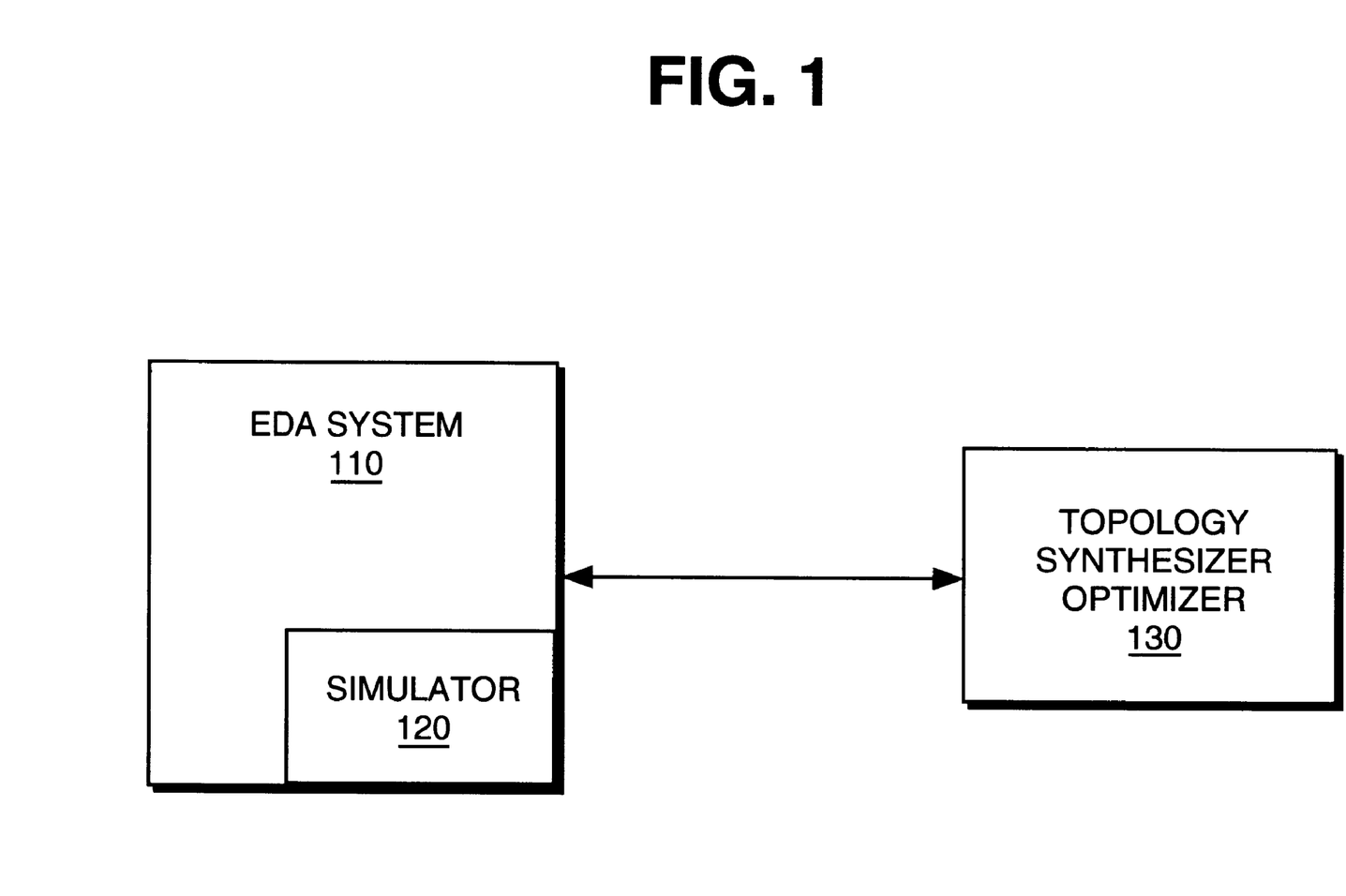
FIG. 1 illustrates one embodiment of an EDA system and a topology synthesizer-optimizer.

FIG. 1 illustrates one embodiment of Electronic Design Automation (EDA) system 110 coupled to topology synthesizer-optimizer (TSO) 130. EDA system 110 represents any of a number of EDA systems. EDA system 110 calls upon TSO 130 to generate topologies for one or more nets in a circuit design. As discussed in detail below, TSO 130 generates a topology based on net constraints using terminator strategies and topology models. In particular, TSO 130 can select a J-tree topology model to generate a topology that meets stringent ringback and monotonicity net constraints.

J-Tree Topology Model

The J-tree model is particularly suited for nets with stringent ringback and monotonicity requirements. The J-tree is based on a theorem which states that first reflected wave ringback does not occur if and only if for each leaf node i, there is some sibling leaf node j such that the distance from i to its parent is equal to the distance from j to its parent. That is, if Pi is i's parent and j is a sibling of i, first reflected wave ringback is reduced if the distance from Pi to i is equal to the distance from Pi to j. A leaf node is a terminal node where a load or driver connects to a net. A parent is an internal branching node in the topology of the net. Designing according to this theorem also ensures improved monotonicity as a result of avoiding ringback.

Figure 2:
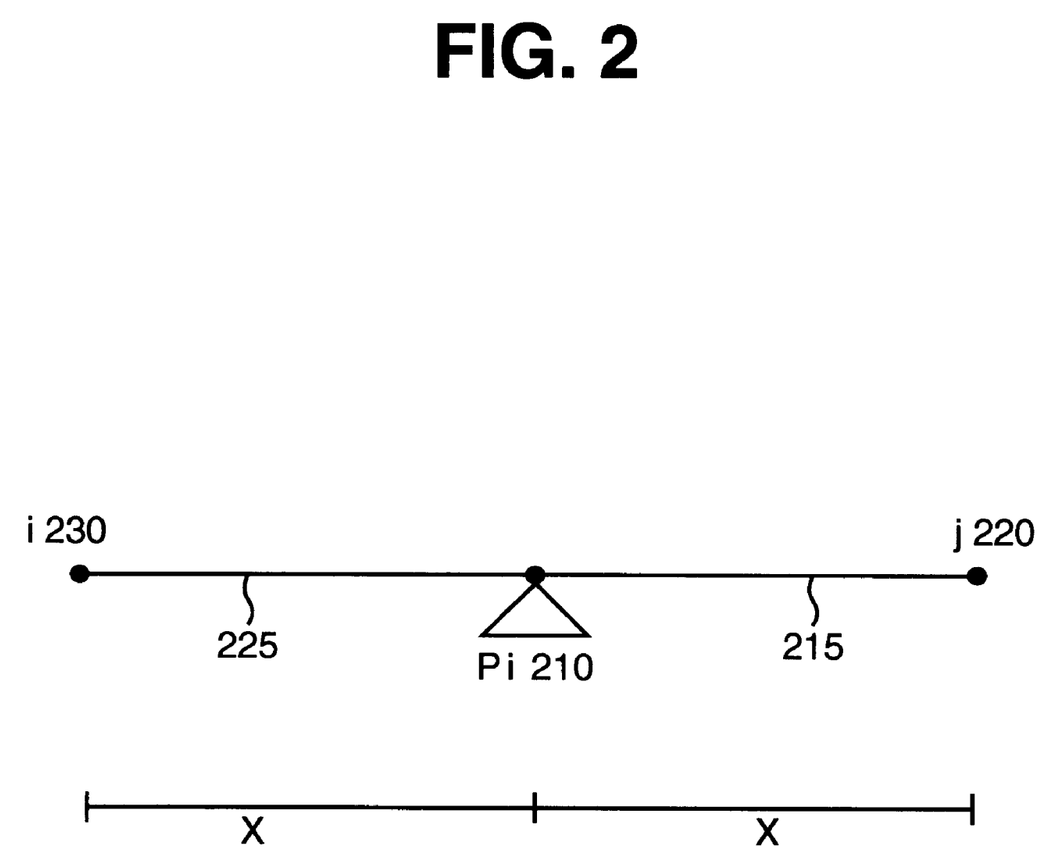
FIG. 2 illustrates one embodiment of a topology according the theorem of the J-tree topology model.

Since subsequent reflected waves are smaller in magnitude than first reflected waves and incident waves, a design criteria that avoids first reflection wave ringback provides a topology that reduces ringback in general. FIG. 2 illustrates a simple example. Pi 210 is a parent node connecting two branches 215 and 225. In this case, Pi 210 is a driver which can assert a step function having a positive amplitude Vx. Ignoring line 215 and sibling node j 220 for the time being, Vx travels over line 225 to node i 230. At node i 230, part of the amplitude Vx is reflected back toward driver Pi 210. The reflected signal will have a negative amplitude as long as node i 230 has a higher impedance than line 225. At Pi 210 the reflected signal reflects back again with a positive amplitude. This is a first reflected wave ringback which will be incident on node i 230 unless it is canceled.

In the illustrated example, sibling node j 220 connects to driver Pi 210 by line 215. Line 215 is equal in length to line 225. The step signal having amplitude Vx is incident upon i 230 and j 220 simultaneously by symmetry. Thus, the topology of FIG. 2 ensures monotonicity, wherein both nodes experience the same magnitude incident signal.

Part of the amplitude Vx is simultaneously reflected from each node. Both reflected signals have a negative amplitude and are incident upon Pi 210. The amplitudes of both reflected waves should be equal if i230 and j220 are impedance matched. As discussed above, the signal reflected from i 230 reflects back off of Pi 210 with a positive amplitude. The signal reflected from j 220, however, partially passes through Pi towards i 230 and its negative amplitude cancels the positive amplitude of the first ringback wave toward i 230. Similarly, the first reflected ringback wave toward j 220 is canceled by the reflected wave from i 230.

Second and subsequent ringback waves may be canceled by waves reflected back from the sibling node as well. Even if they are not all canceled, reflected waves have less magnitude than incident waves, and transmission lines are necessary lossy lines, so the second and subsequent reflected ringback waves will be less disruptive to the first incident signals than first reflected ringback waves. Therefore, ringback constraints can be met in almost every net by eliminating or reducing first reflected ringback waves. Terminators can also be used to reduce ringback in the few situations were second ringback waves are disruptive. For instance, series terminators having equal values can be added to lines 215 and 225 to absorb some of the amplitude of the ringback waves.

Figure 3:
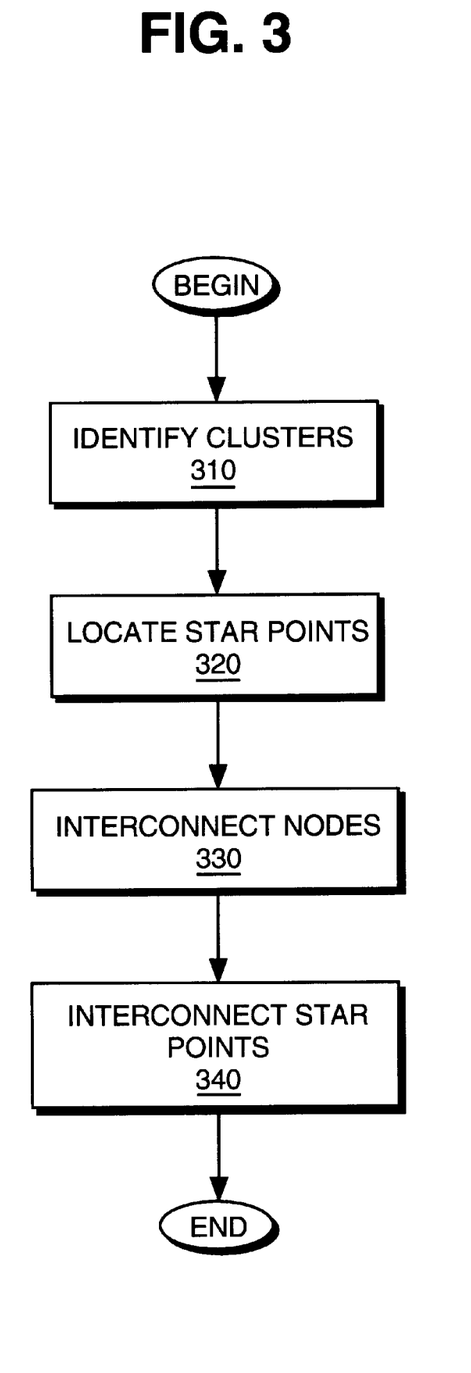
FIG. 3 illustrates the process of one embodiment of the J-tree topology.

The J-tree topology takes advantage of this theorem to reduce first reflected wave ringback, and hence to improve ringback characteristics and monotonicity in a general net. FIG. 3 illustrates of the process of applying the J-tree topology model to a general net. The process can be performed by TSO 130.

First, TSO 130 identifies clusters of nodes in block 310. Each cluster of nodes includes at least a minimum geometric number of leaf nodes. The minimum geometric number of leaf nodes depends on the number of bidirectional drivers in each cluster. If a cluster includes only bi-directional drivers, the minimum geometric number of leaf nodes is three because at least two other nodes are required to cancel reflections for each driver. With at least three nodes, no matter which node is currently driving the net, the other two nodes are siblings. If a cluster has a mixture of drivers and loads, then the minimum geometric number of leaf nodes is two because a single driver with one load can provide good signal quality with a termination at the source.

After the clusters of nodes have been identified, a star point is located for each cluster in block 320. A star point is an internal node to which each leaf node of a cluster connects. In block 330, the leaf nodes are interconnected with their respective star point. An interconnected cluster is similar to a star topology. Like a star topology, each leaf node in the cluster is equidistant from the star point.

In block 340, the star point of each cluster is interconnected using minimum wiring lengths. As discussed below, series terminators may be inserted in the interconnections between star points. An example of a J-tree topology is shown in FIG. 4.

Figure 4:
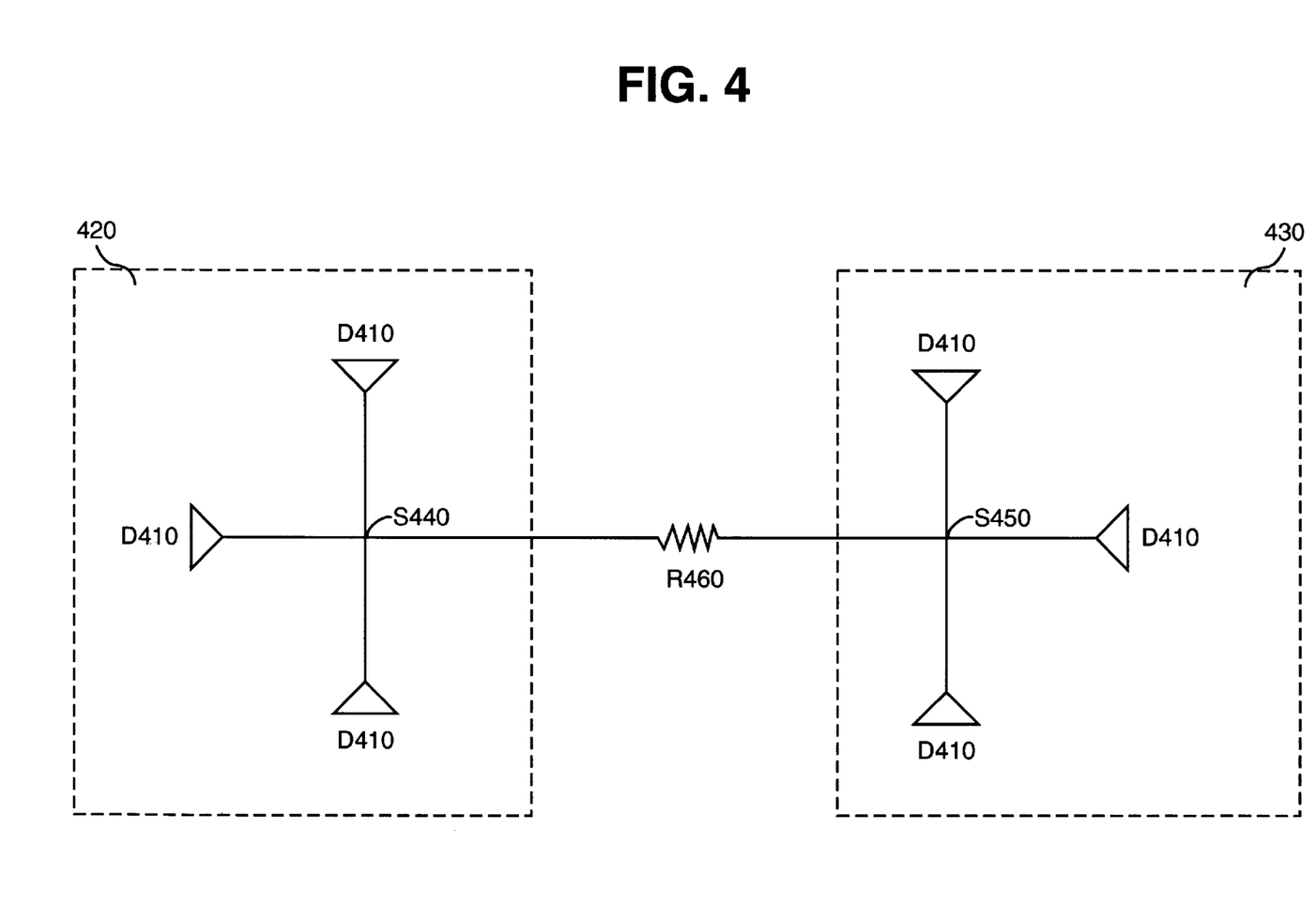
FIG. 4 illustrates a J-tree topology.

FIG. 4 includes six bi-directional drivers D410. Where ringback is a stringent constraint, a star topology could be used to interconnect the drivers. The wiring cost for a star topology is high, however, often requiring more layers in the design. Also, star topologies often have high terminator costs because each branch of the star includes a terminator. Star topologies may also have long delays because incident wave switching is not always possible.

A less expensive alternative, with better delay characteristics and similar ringback characteristics, is the J-tree. To apply the J-tree topology model to the net illustrated in FIG. 4, drivers are grouped into clusters. The minimum geometric number of leaf nodes for a cluster of all bi-directional drivers is three. Therefore, the nodes are grouped into clusters 420 and 430, wherein each cluster has three leaf nodes. Star points S440 and S450 are selected for each cluster so that each leaf node is equidistant to the respective star point. Each leaf node is then interconnected with its respective star point, and star points S440 and S450 are also interconnected.

Any number of terminator selection methods could be used to select series terminator R460. The value of R460 must be low enough so that enough of an incident voltage fr6m one cluster can pass through to provide incident wave switching at the loads on the other cluster. At the same time, the value of R460 should be high enough to limit the reflected waves coming back.

A signal generated by any one of the drivers will be incident on each of the other drivers in the cluster simultaneously. The signal will also be incident upon drivers in the other cluster simultaneously. Considerable skew may occur between clusters, however, depending on the length of the interconnection and the value of terminator R460 between star points S440 and S450. Incident wave switching should occur at all of the bi-directional drivers, thus ensuring monotonicity and minimal delay.

For a star topology, an incident wave must branch off from a star point to all of the loads in the net. For example, if the incident voltage is V, the incident wave voltage provided to each load is V/n where n is the number of branches. The voltage V/n may not be sufficient to provide incident wave switching in the star topology. In the J-tree, on the other hand, an incident wave voltage is provided to one cluster at a time and the voltage is only divided by the number of nodes in a cluster. Thus, incident wave switching is more likely in a J-tree topology than in a star topology.

Topology Selection

Returning to FIG. 1, the J-tree topology model is just one topology model available to TSO 130. EDA system 110 provides TSO 130 with one or more sets of net constraints. Net constraints define the physical characteristics of a net as well as other constraints such as timing, signal quality, and cost constraints. The net constraints can be specified in any of a number of different formats. For instance, a netlist may be used to specify net constraints in a spread sheet format.

For each net, TSO 130 selects from a list of terminator strategies and a library of topology models and applies the terminator-topology combination to the net. Terminator strategies and topology models are used in combination because the switching characteristics for a net can change depending on the termination strategy. That is, for a given net, load A may switch before load B when series termination is used, but load B may switch before load A if parallel termination is used.

After TSO 130 has selected a terminator-topology combination, TSO 130 calls upon simulator 120 to simulate the net and generate a set of net data. Simulator 120 represents any of a number of simulators, such as an application specific simulator or a commonly available SPICE simulator. In one embodiment, simulator 120 performs a time domain simulation. In which case, the net data can include waveforms illustrating the simulation results with respect to time at each load on the net for each driver on the net. TSO 130 then uses the set of net data to determine if the set of net constraints have been met. For instance, overshoot, undershoot, ringback, etc. can all be ascertained from the net data and compared to the net constraints.

Figure 5:
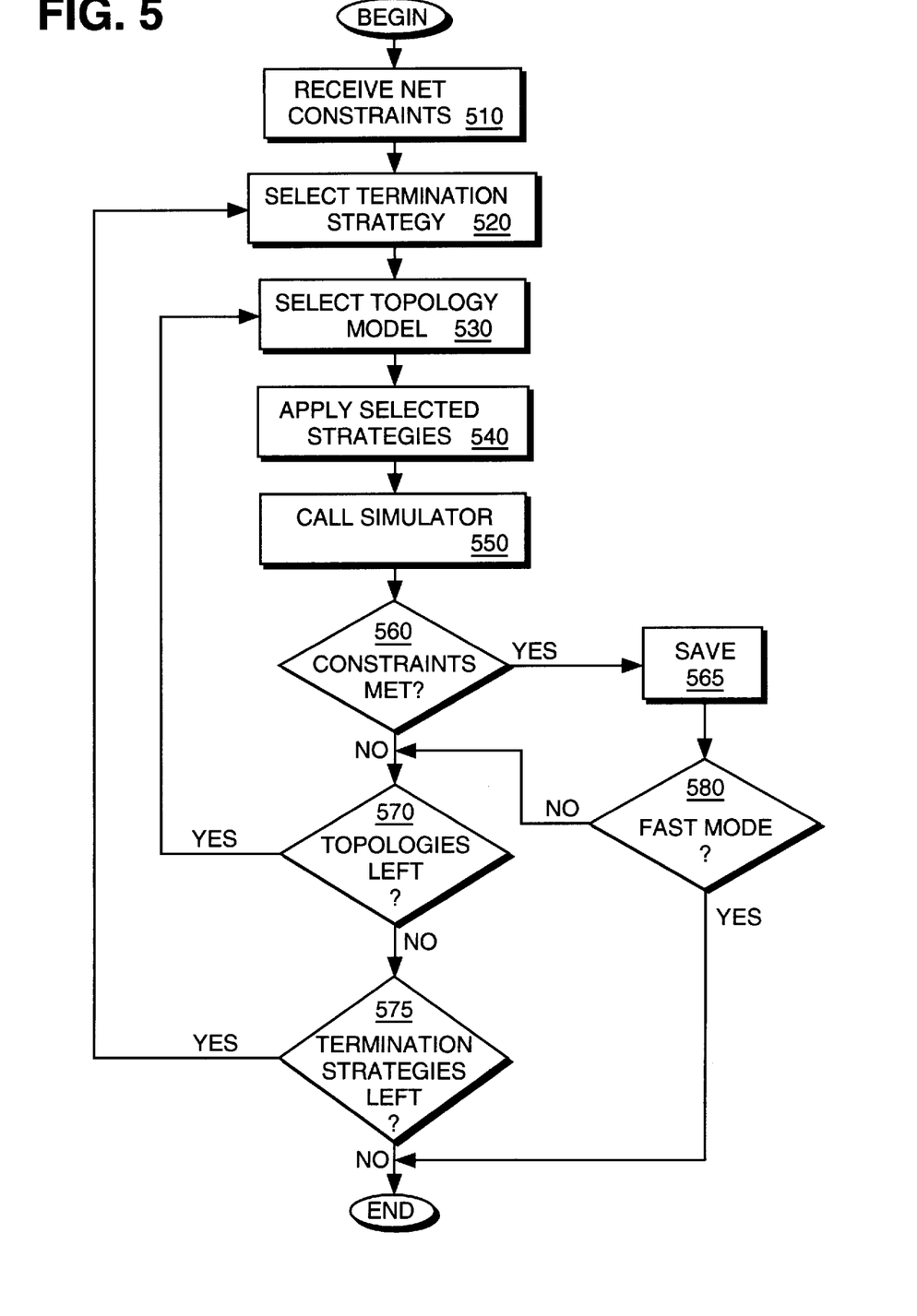
FIG. 5 illustrates the process of one embodiment of the topology synthesizer-optimizer.

FIG. 5 illustrates the process of one embodiment of TSO 130. An over view of the process shows that TSO 130 iteratively selects a combination of a termination strategy and topology model, applies the combination to a net, and determines if the net constraints are met.

Specifically, TSO 130 receives a set of net constraints in block 510 from EDA system 110. The set of net constraints defines one or more nets in a circuit design and includes timing and signal quality constraints for each net.

In block 520, TSO 130 selects a termination strategy to apply to one of the nets. A list of termination strategies from which TSO 130 can select may be provided in several different ways. For instance, the net constraints could include the list, wherein termination strategies and available terminator values were specified when the designer created the set of net constraints. The list of strategies could also be specified at the time the net constraints are sent to TSO 130 wherein, for instance, the list is selected from a database of lists available to EDA system 110. Alternately, TSO 130 may maintain an internal default list of termination strategies from which TSO 130 can choose. An example termination strategy list may include series termination with terminator values of 22 ohms, 44 ohms, and 65 ohms, pull-up termination with terminator values of 35 ohms, 55 ohms, and 75 ohms, pull-down termination with terminator values of 35 ohms, 55 ohms, and 75 ohms, or no termination whatsoever.

Termination strategies and terminator values depend upon the type of technology in which the design will be manufactured. For instance, the range of terminator values may be different in CMOS designs and TTL designs.

Next, in block 530, TSO 130 selects a topology model. A list of topologies for each termination strategy may be provided along with the net constraints. Alternately, TSO 130 may select the best topology from an internally generated list that includes the J-tree topology model as discussed above. The list will be determined by the particular termination strategy and the number of drivers in a given net. For example, a star topology may be applied to a multiple driver net, but the star topology may only be applied with series terminators. A daisy chain, for example, may be applied only to single driver nets, but with series and parallel terminators.

The order in which termination strategies and topology modes are selected may depend on the mode of operation. TSO 130 includes at least two modes of operation —the fast mode and the performance mode. The order in which termination strategies and topology models are selected is only important when TSO 130 operates in the fast mode. In fast mode, TSO 130 identifies the first termination-topology combination that meets the net constraints and provides that combination to EDA system 110. In which case, the topology models and termination strategies should be selected in the order of the most likely combination to meet the constraints to the least likely combination to meet the constraints. This way, the first successful combination is likely to be found as soon as possible. For instance, where the cost constraint is the most stringent constraint, combinations should be selected in order from least expensive to most expensive so that the least expensive combination that meets all of the constraints is found as soon as possible.

In performance mode, however, TSO 130 tries all terminator-topology combinations and identifies the topology that meets all of the constraints by the largest margins. TSO 130 then provides that combination to EDA system 110. Therefore, in performance mode, the order in which combinations are selected does not matter because TSO 130 will take the time to try all of the combinations to find the best one. In other words, TSO 130 selects the best topology in performance mode and TSO 130 selects the first topology that meets the constraints in fast mode.

TSO 130 may have additional intermediate modes of operation. For instance, in an intermediate mode, TSO 130 may try all combinations within a subset of combinations.

When the selection order matters, TSO 130 may select a termination strategy and a topology model in any of several different ways. TSO 130 may simply select the combinations in the order in which they are listed. In which case, the strategies and models should be listed in a specific order. For instance, series termination is generally less expensive than parallel termination, and series termination generally requires less driver power. Therefore, series termination should be listed before parallel termination when TSO 130 selects combinations in the order in which they are listed.

Alternately, TSO 130 could select combinations in different orders for different nets within the same design depending on factors such as fan out, the number of drivers, cost, and signal quality constraints like skew, ringback, and monotonicity. For instance, the J-tree combined with series termination may be selected for nets with many bi-directional drivers when ringback and cost constraints are stringent. Where cost is less stringent, a star topology with series termination may be selected first. The order may be user specified too. For instance, the order could be included in the net constraints provided by EDA 110 or provided in any of a number of different formats.

The mode of operation, and therefore the significance of selection order, may also be different for each net within a design. For instance, the mode of operation could be selected depending on how critical the net is in the design. Similarly, TSO 130 may automatically select either fast mode or performance mode depending on factors such as fan out, the number of drivers on a net, and the margin of error left by the net constraints. For instance, TSO 130 may automatically apply the performance mode to nets having particularly stringent net constraints, numerous bi-directional drivers, and numerous loads.

After selecting a termination strategy and a topology strategy, TSO 130 applies the combination to a net in block 540. The application of the J-tree topology model was discussed above with respect to FIG. 3. The application of other terminator-topology combinations can be performed in any number of ways. For instance, if TSO 130 selects series termination and a daisy chain topology model, TSO 130 interconnects all of the drivers and loads on the net and inserts series terminators between the loads. Similarly, for a star topology, each node is connected to a centralized star point which is equidistant from all of the drivers and loads, and series terminators are inserted in each branch of the star. Any number of termination selection techniques and minimal wiring length routines can be used.

If, in block 550, all of the loads and drivers are successfully interconnected using the selected combination, then TSO 130 calls simulator 120 in EDA system 110. In one embodiment, simulator 120 provides TSO 130 with a set of net data specifying topology characteristics in the time domain. For instance, simulator 120 may simulate a step input from each driver in the net one at a time, and provide time domain waveforms at each load in the net corresponding to each driver input. From the waveforms, TSO 130 is able to ascertain if the net constraints are met. For instance, TSO 130 will be able to recognize overshoot, undershoot, skew, ringback, monotonicity, and delay from each driver to each load.

In block 560, if the net constraints are met, the topology is saved in block 565. In block 580, if TSO 130 is operating in fast mode, TSO 130 will end and the terminator-topology combination will be provided to EDA system 110. If TSO 130 is not operating in fast mode in block 580, or if the net constraints are not met in block 560, TSO 130 will proceed to block 570 and check to see if more topology models remain to be selected. If there are more models available, TSO 130 returns to select the next topology model in block 530. If the last topology model has been tried in block 570, TSO 130 will proceed to block 575 and check to see if more termination strategies remain to be selected. If there are termination strategies left, TSO 130 will return to block 520 to select the next termination strategy. If all of the termination strategies have been tried, then TSO 130 will proceed to the end.

If the end is reached in either the fast mode or performance mode and no termination-topology combinations were saved in block 565, then TSO 130 will return an indication to EDA system 110 indicating that the net constraints could not be met. In fast mode, a maximum of one termination-topology combination will be saved in block 565. In which case, if a combination has been saved, the combination will be provided to EDA system 110. In performance mode however, several termination-topology combinations may have been saved in block 565. That is, if any combinations met the constraints, all of the successful combinations may have been saved. In which case all of the combinations can be provided to EDA system 110, wherein EDA system 110 can select which combination to use. Alternately, the successful combinations may be saved one at a time wherein better combinations over write older combinations in block 565. In which case, only the best combination is provided to EDA system 110. For instance, TSO 130 may perform a costing analysis on each combination. If a combination meets the timing and signal quality constraints, TSO 130 will assign a cost to the combination. If another combination has a lower cost, it will replace the previously stored combination. The costing analysis may include wire length cost, termination cost, signal quality cost, and other such factors, wherein signal quality cost is a measure of how far the signal quality is from the limits of the net constraints. That is, a combination that produces a signal delay that is in the middle of the range between maximum and minimum delay will have a lower signal delay cost than a combination that produces a signal delay that is very near either the minimum or maximum delay.

In the illustrated embodiment, each topology model in the library is simulated before moving on to the next termination strategy. In alternate embodiments, each termination strategy can be simulated before moving on to the next topology model. Other embodiments may use a combined library of topology-terminator combinations from which a variety of combinations can be selected at random or in any specified order.

Once a topology is identified for one net, it can be rapidly reproduced for several identical nets. For instance, the topology can be determined for one line of a multi-line bus and then duplicated for the other lines of the bus. It will be used as the first choice to be tried for the other nets in the bus.

Thus, TSO 130 is able to automatically generate a topology for a circuit design relieving the circuit designer from the tedious task of manually creating the topology.

Any number of hardware systems can be used to perform the functions of EDA system 110 and TSO 130. For example, each system may be represented by a broad category of computer systems known in the art, such as a computer system equipped with a high performance microprocessor(s), such as the Pentium® processor, Pentium® Pro processor, or Pentium® II processor manufactured by and commonly available from Intel Corporation of Santa Clara, Calif., or the Alpha® processor manufactured by Digital Equipment Corporation of Maynard, Mass.

Figure 6:
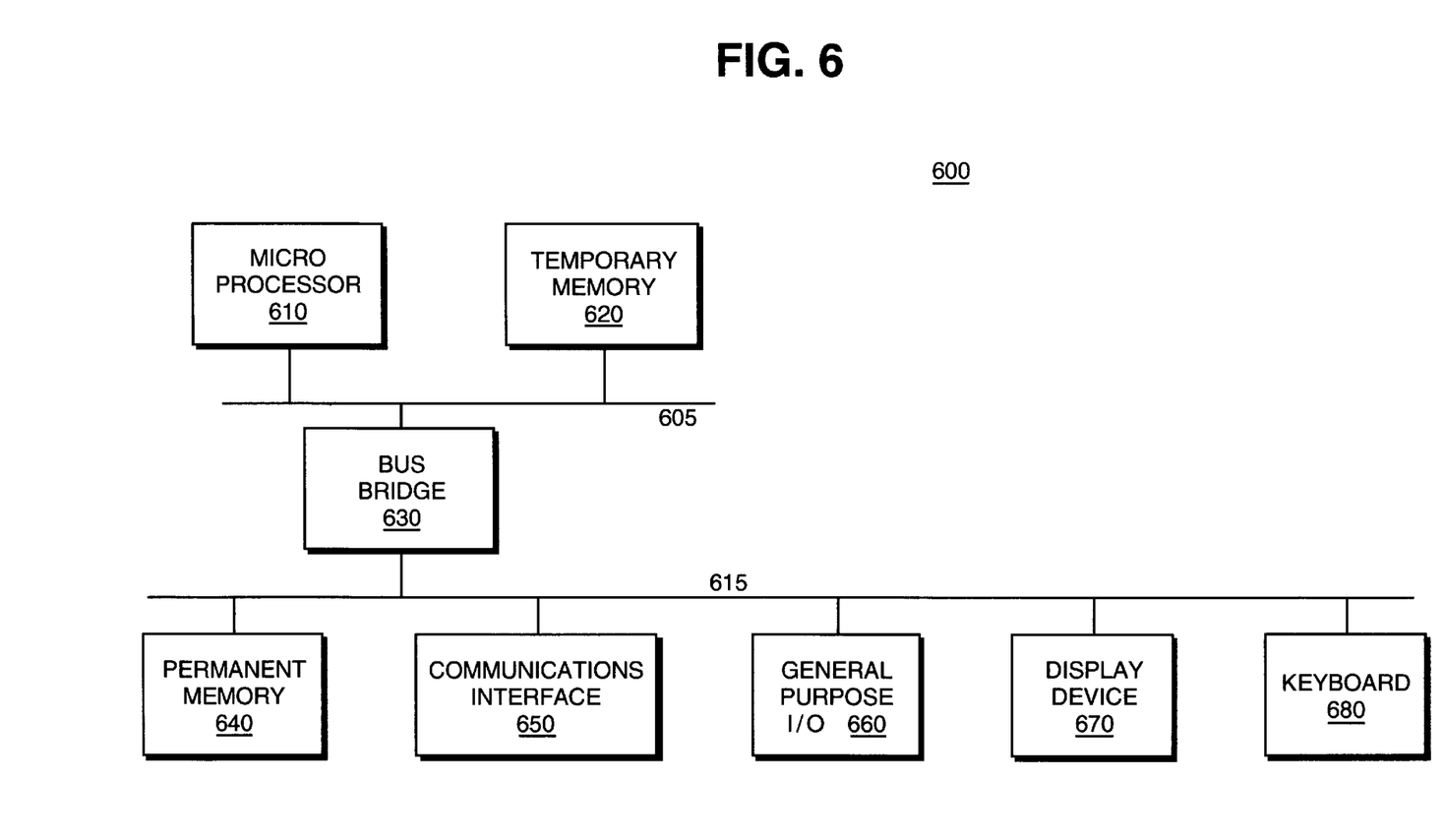
FIG. 6 illustrates one embodiment of a hardware system operative to perform the process of an EDA system and a topology synthesizer-optimizer.

FIG. 6 illustrates one embodiment of a suitable hardware system 600. In the illustrated embodiment, hardware system 600 includes microprocessor 610 coupled to high performance bus 605, which is coupled to input/output (I/O) bus 615 through bus bridge 630. Temporary memory 620 is coupled to bus 605. Permanent memory 640 is coupled to bus 615. Display device 670, keyboard 680, communications interface 650, and general purpose I/O 660 are all coupled to bus 615. Communications interface 650 can couple system 600 to, for instance, a network. General purpose I/O 660 can couple hardware system 600 to any of a number of external peripheral devices.

Certain embodiments may include additional components, may not require all of the above components, or may combine one or more components. For instance, temporary memory 620 may be on-chip with microprocessor 610. Alternatively, permanent memory 640 may be eliminated and temporary memory 620 may be replaced with an electrically erasable programmable read only memory (EEPROM), such as a Flash memory, wherein software routines are executed in place from the EEPROM. Some implementations may employ a single bus, to which all of the components are coupled, or a number of additional buses. Additional components may also be included in the hardware system, such as additional processors, storage devices like a CD ROM, memories, and other peripheral components known in the art.

In one embodiment, the procedures of EDA system 110 and TSO 130, as discussed above, are implemented as a series of software routines run by hardware system 600. These software routines comprise a plurality or series of instructions to be executed by a microprocessor in a hardware system, such as microprocessor 610. Initially, the series of instructions can be stored on a storage device, such as permanent memory 640. It is to be appreciated, however, that the series of instructions can be stored using any conventional storage medium, such as a diskette, CD-ROM, magnetic tape, digital video or versatile disk (DVD), laser disk, ROM, Flash memory, etc. It is also to be appreciated that the series of instructions need not be stored locally, and can be received from a remote storage device, such as another server system on any of a number of networks, a CD ROM device, a floppy disk, etc. The instructions may be copied from the storage device into temporary memory 620 and then accessed and executed by microprocessor 610. In one implementation, these software routines are written in the C++ programming language. It is to be appreciated, however, that these software routines may be implemented in any of a wide variety of programming languages.

In alternate embodiments, EDA system 110 and TSO 130 are implemented in discrete hardware or firmware. For example, one or more application specific integrated circuits (ASICs) could be programmed with the above described functions of EDA system 110 and TSO 130. In another example, EDA system 110 and TSO 130 could be implemented in one or more ASICs on an additional circuit board and the circuit board could be inserted into hardware system 600. Alternately, EDA system 110 and TSO 130 could be implemented on separate systems such as system 600 and each could communicate with the other over various communications media such as peripheral ports or networks.

Thus, an improved EDA system to synthesize and optimize net topologies to meet ringback and monotonicity requirements is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A machine implemented method comprising:
   identifying at least two clusters of nodes, at least one cluster comprising at least three nodes;
   locating a star point for each cluster, wherein the nodes in each cluster are equidistant from the star point for each cluster;
   interconnecting the nodes in each cluster to the star point for each cluster; and interconnecting the star point for each cluster to create a J-tree topology.

2. The method of claim 1 wherein at least one node comprises a bi-directional driver.

3. A machine implemented method comprising:
   receiving a set of net constraints defining a first net;
   selecting a termination strategy from a list of termination strategies to apply to the first net;
   selecting a J-tree topology model from a library of topology models to apply to the first net;
   applying the selected tenninator strategy and the J-tree topology model to the first net to create a terminator-topology combination, wherein applying the J-tree topology model comprises:
      identifying at least two clusters of nodes, at least one cluster comprising at least three nodes,
      locating a star point for each cluster, wherein the nodes in each cluster are equidistant from the star point for each cluster,
      interconnecting the nodes in each cluster to the star point for each cluster, and
      interconnecting the star point for each cluster to create a J-tree topology;
   determining if the set of net constraints is met based on a set of net data
   generated at least in part based on the applied termination-topology combination; and
   repeating said selecting and applying if necessary.

4. The method of claim 3 wherein the repeating is necessary for each terminator strategy in the list and each topology model in the library based on one of a fast mode and a performance mode, wherein in the fast mode the repeating stops when a first terminator-topology combination meets the set of net constraints, and wherein in the performance mode all terminator-topology combinations are simulated and a best terminator-topology combination is selected.

5. The method of claim 3 wherein the library of topology models further includes at least one of an H-tree model, a star model, a daisy chain model, and a branched daisy chain model.

6. The method of claim 3, wherein the list of termination strategies includes at least one of a series termination strategy, a pull-up termination strategy, a pull-down termination strategy, and a source-load-terminator (SLT) termination strategy.

7. The method of claim 3, wherein the determining comprises:
   calling a simulator to simulate the terminator-topology combination to provide a set of waveforms; and
   generating the set of net data based at least in part on a costing analysis, said costing analysis including at least one of wire length cost, terminator cost, and signal quality parameters, said signal quality parameters based at least in part on the set of waveforms.

8. The method of claim 3 wherein applying the J-Tree topology at least one node comprises a bi-directional driver.

9. An apparatus comprising:
   a topology synthesizer-optimizer to receive a set of net constraints defining a first net, select a termination strategy from a list of termination strategies to apply to the first net, select a J-tree topology model from a library of topology models to apply to the first net, apply the selected terminator strategy and the J-tree topology model to the first net to create a terrninator-topology combination, determine if the set of net constraints is met based on a set of net data generated at least in part based on the applied termination-topology combination,
   and repeat said selecting and applying if necessary, wherein to apply the J-tree topology the topology synthesier-optimizer is to identify at least two dusters of nodes, at least one cluster comprising at least three nodes, locate a star point for each cluster, wherein the nodes in each duster are equidistant from the star point for each duster,
   interconnect the nodes in each duster to the star point for each cluster, and interconnect the star point for each cluster to create a J-tree topology.

10. The apparatus of claim 9 further comprising:
    an electronic design automation (EDA) system coupled to the topology synthesizer-optimizer to provide the net constraints.

11. The apparatus of claim 9 wherein applying the J-Tree topology at least one node comprises a bi-directional driver.

12. A machine readable storage medium having stored thereon machine readable instructions, the execution of said instructions to implement a method comprising:
    receiving a set of net constraints defining a first net;
    selecting a termination strategy from a list of termination strategies to apply to the first net,
    selecting a J-tree topology model from a library of topology models to apply to the first net;
    applying the selected terminator strategy and the J-tree topology model to the first net to create a terminator-topology combination wherein applying the J-tree topology model comprises:
       identifying at least two dusters of nodes, at least one cluster comprising at least three nodes,
       locating a star point for each cluster, wherein the nodes in each cluster are equidistant from the star point for each cluster,
       interconnecting the nodes in each cluster to the star-point for each cluster, and
       interconnecting the star point for each duster to create a J-tree topology;
    determining if the set of net constraints is met based on a set of net data generated at least in part based on the applied termination-topology combination; and
    repeating said selecting and applying if necessary.

13. The machine-readable medium of claim 12 wherein applying the selected terminator strategy and the J-Tree topology at least one node comprises a bi-directional driver.

* * * * *

UNITED STATES PATENT AND TRADEMARK OFFICE
CERTIFICATE OF CORRECTION

PATENT NO. : 6,223,334 B1
DATED : April 24, 2001
INVENTOR(S) : Suaris et al.

It is certified that error appears in the above-identified patent and that said Letters Patent is hereby corrected as shown below:

Column 3,
Line 26, "were" should read -- where --.

Column 4,
Line 17, "fr6m" should read -- from --.

Column 9,
Line 47-48, "set of net data [RETURN] generated at least" should read -- set of net data generated at least --.

Column 10,
Line 18, "terrninator-" should read -- terminator --.
Lines 22-23, "combination, [RETURN] and repeat said" should read -- combination, and repeat said --.
Line 25, "synthesier-optimizer" should read -- synthesizer-optimizer --, and "dusters" should read -- clusters --.
Lines 29-30, "for each duster, [RETURN] interconnect the nodes" should read -- for each cluster, interconnect the nodes --.
Lines 30, and 58, "duster" should read -- cluster --.
Line 51, "dusters" should read -- cluster --.
Line 56, "star-" should read -- star --.

Signed and Sealed this

Twenty-third Day of April, 2002

*Attest:*

*Attesting Officer*

JAMES E. ROGAN
*Director of the United States Patent and Trademark Office*